United States Patent
Lhee et al.

(10) Patent No.: US 12,484,380 B2
(45) Date of Patent: Nov. 25, 2025

(54) DISPLAY PANEL

(71) Applicant: SAMSUNG DISPLAY CO., LTD., Yongin-si (KR)

(72) Inventors: Zail Lhee, Yongin-si (KR); Yongsung Park, Yongin-si (KR); Donghyun Lee, Yongin-si (KR); Junghun Yi, Yongin-si (KR); Joohye Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 523 days.

(21) Appl. No.: 18/145,814

(22) Filed: Dec. 22, 2022

(65) Prior Publication Data

US 2023/0209901 A1 Jun. 29, 2023

(30) Foreign Application Priority Data

Dec. 24, 2021 (KR) .................. 10-2021-0187787
Oct. 4, 2022 (KR) .................. 10-2022-0126512

(51) Int. Cl.
*H10K 59/121* (2023.01)
*H10K 59/126* (2023.01)
*H10K 59/131* (2023.01)

(52) U.S. Cl.
CPC ....... *H10K 59/1213* (2023.02); *H10K 59/126* (2023.02); *H10K 59/131* (2023.02)

(58) Field of Classification Search
CPC ............. H10K 59/1213; H10K 59/126; H10K 59/131; H10D 89/60; H10D 86/00
See application file for complete search history.

(56) References Cited

U.S. PATENT DOCUMENTS

| | | | |
|---|---|---|---|
| 10,978,538 B2 | 4/2021 | Wang et al. | |
| 11,386,854 B2 | 7/2022 | Kim et al. | |
| 2019/0296099 A1* | 9/2019 | Lee | H10K 59/131 |
| 2021/0066418 A1* | 3/2021 | Seo | H10K 71/231 |
| 2021/0305340 A1 | 9/2021 | Kim et al. | |
| 2021/0385959 A1 | 12/2021 | Wang | |
| 2022/0231096 A1* | 7/2022 | Kim | H10K 59/353 |
| 2022/0238608 A1* | 7/2022 | Moon | G03F 1/50 |
| 2023/0363239 A1* | 11/2023 | Song | H10K 59/50 |

FOREIGN PATENT DOCUMENTS

| | | | |
|---|---|---|---|
| KR | 10-2020-0016421 A | 2/2020 | |
| KR | 10-2020-0019306 A | 2/2020 | |
| KR | 10-2020-0029103 A | 3/2020 | |

* cited by examiner

*Primary Examiner* — Douglas W Owens
(74) *Attorney, Agent, or Firm* — Womble Bond Dickinson (US) LLP

(57) ABSTRACT

A display panel includes a shielding layer overlapped with a semiconductor layer of a transistor connected between a data line and a driving transistor.

20 Claims, 17 Drawing Sheets

DISPLAY PANEL

CROSS-REFERENCE TO RELATED APPLICATIONS

The present application claims priority to and the benefit of Korean Patent Application No. 10-2021-0187787, filed on Dec. 24, 2021, in the Korean Intellectual Property Office, and Korean Patent Application No. 10-2022-0126512, filed on Oct. 4, 2022, in the Korean Intellectual Property Office, the entire disclosures of each of which are incorporated herein by reference.

BACKGROUND

1. Field

Aspects of one or more embodiments relate to a display panel and a display device including the same.

2. Description of the Related Art

Recently, the various possible uses and applications for display devices has become more diversified. Furthermore, display devices have become relatively thinner and lighter and the range of potential uses thereof has expanded.

As a display device is used in various ways, the shape of a display device may be designed by various methods, and also, functions to be applied or linked to a display device been increased.

The above information disclosed in this Background section is only for enhancement of understanding of the background and therefore the information discussed in this Background section does not necessarily constitute prior art.

SUMMARY

Aspects of one or more embodiments include a display device with relatively improved display quality. However, such characteristics are merely examples, and the scope of embodiments according to the present disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate in which a display area and a peripheral area are defined, the display area including a pixel area in which a row and a column cross each other and the peripheral area surrounding the display area, a first thin film transistor located in the pixel area, located between a driving voltage line and a display element, and including a first semiconductor layer and a first gate electrode overlapped with the first semiconductor layer, a second thin film transistor located in the pixel area between a data line and the first thin film transistor, and including a second semiconductor layer and a second gate electrode overlapped with the second semiconductor layer, and a first shielding layer located between the substrate and the second semiconductor layer and overlapped with the second semiconductor layer.

According to some embodiments, the display panel may further include a first connection line connecting the first shielding layers of the pixel areas adjacent to each other in a row direction, and a second connection line connecting the first shielding layers of the pixel areas adjacent to each other in a column direction.

According to some embodiments, the display panel may further include a second shielding layer between the substrate and the first semiconductor layer and overlapped with the first semiconductor layer.

According to some embodiments, the first semiconductor layer and the second semiconductor layer may each include a silicon semiconductor.

According to some embodiments, the first shielding layer may be connected with the second shielding layer.

According to some embodiments, the display panel may further include a first connection line connecting the second shielding layers of the pixel areas adjacent to each other in a row direction, and a second connection line connecting the second shielding layers of the pixel areas adjacent to each other in a column direction.

According to some embodiments, the first shielding layer, the second shielding layer, the first connection line, and the second connection line may be formed as a single body.

According to some embodiments, the display panel may further include an outer line in the peripheral area and connected to the first connection line and the second connection line.

According to some embodiments, a voltage applied through the driving voltage line may be the same as a voltage applied through the first shielding layer.

According to some embodiments, the first shielding layer may include metal.

According to one or more embodiments, a display panel includes a substrate including a display area and a peripheral area surrounding the display area, a pixel circuit in a pixel area in which a row and a column cross each other in the display area of the substrate, and including a driving transistor and a switching transistor between a data line and the driving transistor, and a shielding layer including a first pattern overlapped with the driving transistor, a second pattern overlapped with the switching transistor, a first connection line extending from the first pattern in a row direction, and a second connection line extending from the first pattern in a column direction.

According to some embodiments, the first connection line may connect the first patterns in the pixel areas adjacent to each other in a row direction, and the second connection line may connect the first patterns in the pixel areas adjacent to each other in a column direction.

According to some embodiments, the first pattern may be between the substrate and a semiconductor layer of the driving transistor, and the second pattern may be between the substrate and a semiconductor layer of the switching transistor.

According to some embodiments, the semiconductor layer of the driving transistor and the semiconductor layer of the switching transistor may each include a silicon semiconductor.

According to some embodiments, the first pattern may be connected with the second pattern.

According to some embodiments, the first pattern, the second pattern, the first connection line, and the second connection line may be formed as a single body.

According to some embodiments, the display panel may further include an outer line in the peripheral area and connected to the first connection line and the second connection line.

According to some embodiments, the driving transistor may be between a driving voltage line and a display element, and a voltage applied through the driving voltage line may be the same as a voltage applied through the shielding layer.

According to some embodiments, the display panel may further include an outer line in the peripheral area and connected to the first connection line and the second connection line, and a driving voltage supply line in the peripheral area and connected to the driving voltage line, wherein the outer line may be connected to the driving voltage supply line.

According to some embodiments, the shielding layer may include metal.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
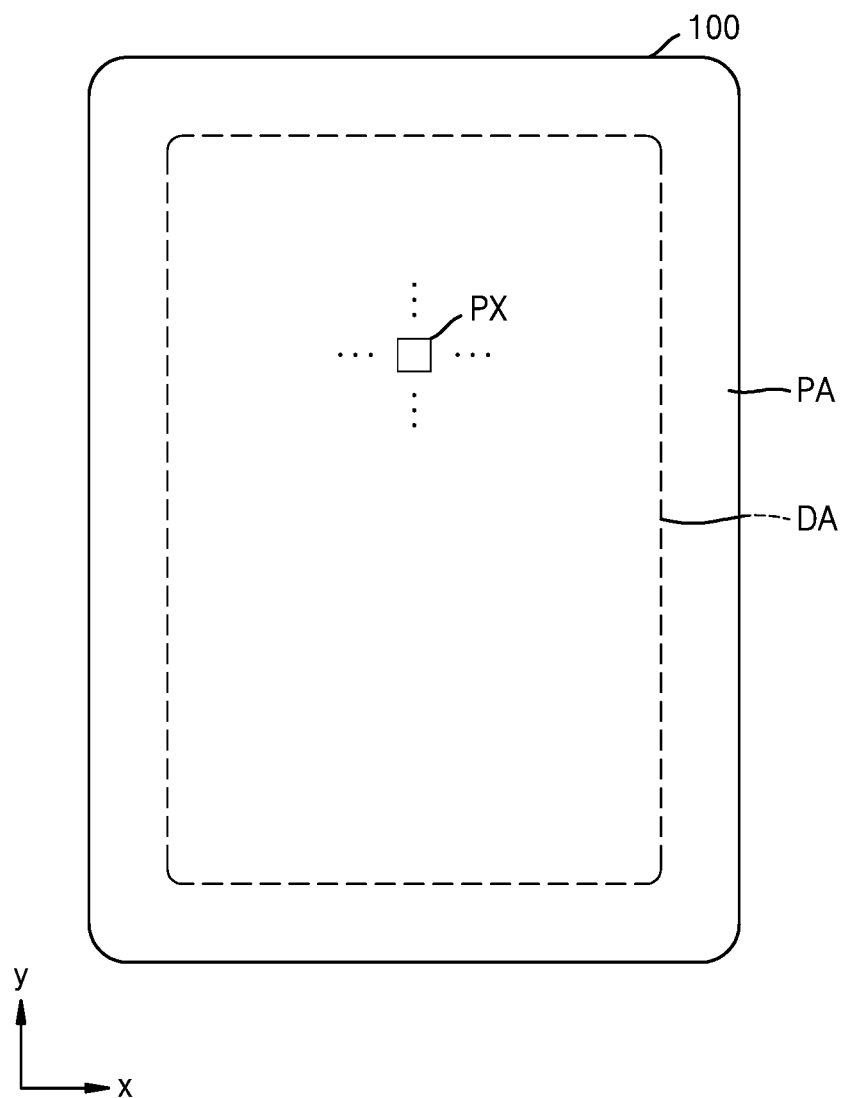
FIG. 1 is a schematic plan view of a display device according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

In the following embodiments, while such terms as "first," "second," etc., may be used to describe various elements, such elements must not be limited to the above terms. The above terms are used only to distinguish one element from another.

According to some embodiments, the expression of singularity in the specification includes the expression of plurality unless clearly specified otherwise in context.

According to some embodiments, terms such as "include" or "comprise" may be construed to denote a certain characteristic or constituent element, but may not be construed to exclude the existence of or a possibility of addition of one or more other characteristics or constituent elements.

In the following embodiments, it will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of elements in the drawings are arbitrarily illustrated for convenience of explanation, the following embodiments are not limited thereto.

In the specification, the expression such as "A and/or B" may include A, B, or A and B. Furthermore, the expression such as "at least one of A and B" may include A, B, or A and B.

According to some embodiments, below, the meaning that the wiring "extends in the first direction or the second direction" includes not only extending in a linear shape, but also extending in a zigzag or a curve along the first direction or the second direction.

In the following embodiments, when referred to as "in a plane," this means when an object part is viewed from above, and when it is referred to as "in a cross-section," it means when the cross-section where the object part is cut vertically is viewed from the side. In the following embodiments, a first element "overlapping" a second element denotes that the first element is located on or under the second element.

FIG. 1 is a schematic plan view of a display device according to some embodiments.

Referring to FIG. 1, the display device may include a display panel 10, and a cover window for protecting the display panel 10 may be further located (arranged) on the display panel 10.

The display panel 10 may include the display area DA for implementing an image and the peripheral area PA outside the display area DA. The peripheral area PA may be a kind of a non-display area in which a plurality of pixels PX are not located. The display area DA may be entirely surrounded by the peripheral area PA. Various constituent elements forming the display panel 10 are located on a substrate 100. Accordingly, it may be said that the substrate 100 includes the display area DA and the peripheral area PA.

The pixels PX may be located in the display area DA. Each of the pixels PX may include a display element. The display element may be connected to a pixel circuit for driving each pixel PX. According to some embodiments, the display element may be an organic light-emitting diode OLED. Each of the pixels PX may emit, for example, red, green, blue, or white light through the organic light-emitting diode OLED.

Assuming that the display area DA has a planar shape or surface, the display area DA may have a rectangular shape as illustrated in FIG. 1. But, embodiments are not limited thereto, and according to some embodiments, the display area DA may have a polygonal shape, such as a triangle, a pentagon, a hexagon, and the like, a circular shape, an oval shape, an amorphous shape, or the like.

The peripheral area PA, which is an area arranged around the display area DA, may be an area that does not display an image. Various wirings for transmitting electrical signals to be applied to the display area DA, outside circuits electrically connected to pixel circuits, pads on which a printed circuit board or a driver IC chip adheres may be located in the peripheral area PA.

Figure 2:
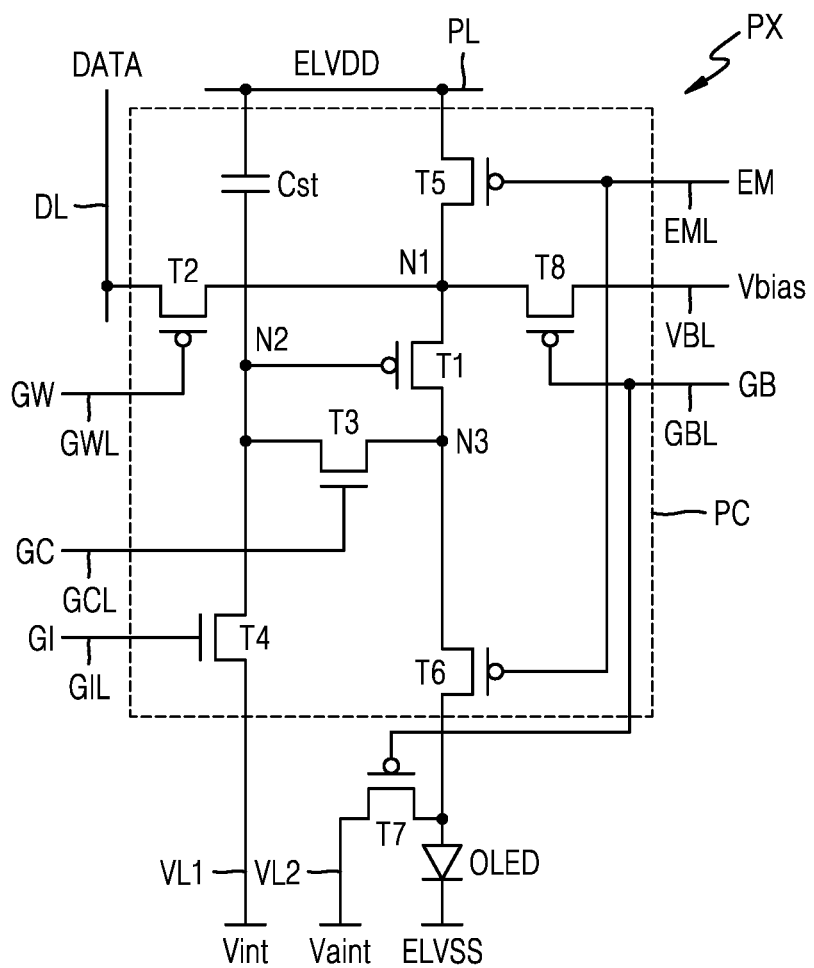
FIG. 2 is an equivalent circuit diagram of a pixel according to some embodiments.

FIG. 2 is an equivalent circuit diagram of the pixel PX according to some embodiments.

Referring to FIG. 2, each pixel PX may include a pixel circuit PC and the organic light-emitting diode OLED as the display element connected to the pixel circuit PC. The pixel circuit PC may include a plurality of first to eighth transistors T1 to T8, a capacitor Cst, and signal lines connected thereto. The signal lines may include a data line DL, a first gate line GWL, a second gate line GCL, a third gate line GIL, a fourth gate line EML, a fifth gate line GBL, a first initialization voltage line VL1, a second initialization voltage line VL2, a driving voltage line PL, and a bias voltage line VBL.

The first gate line GWL, the second gate line GCL, the third gate line GIL, the fourth gate line EML, and the fifth gate line GBL may be gate control lines to which a gate signal to control the turn-on and turn-off of a transistor is applied. The driving voltage line PL may be configured to transmit a driving voltage ELVDD to the first transistor T1. The driving voltage ELVDD may be a high voltage supplied to a pixel electrode (first electrode or anode) of the organic light-emitting diode OLED included in each of the pixels PX. The first initialization voltage line VL1 may be configured to transmit, to each pixel PX, a first initialization voltage Vint to initialize the first transistor T1. The second initialization voltage line VL2 may be configured to transmit, to each pixel PX, a second initialization voltage Vaint to initialize the organic light-emitting diode OLED. The bias voltage line VBL may transmit a bias voltage Vbias to the first transistor T1.

The first transistor T1 may be a driving transistor, and the second to eighth transistors T2 to T8 may be switching transistors. In FIG. 2, among the first to eighth transistors T1 to T8, the third transistor T3 and the fourth transistor T4 are N-type transistors, and the other transistors are P-type transistors. According to the type (N-type or P-type) of a transistor and/or the operation conditions, a first terminal of each of the first to eighth transistors T1 to T8 may be a source terminal or a drain terminal, and a second terminal thereof may be a terminal different from the first terminal. For example, when the first terminal is a source terminal, the second terminal may be a drain terminal. According to some embodiments, the source terminal and the drain terminal may be referred to, in a mixed way, as a source electrode and a drain electrode, respectively.

The first transistor T1 may be connected between the driving voltage line PL and the organic light-emitting diode OLED. The first transistor T1 may be electrically connected to the driving voltage line PL via the fifth transistor T5, and may be electrically connected to the organic light-emitting diode OLED via the sixth transistor T6. The first transistor T1 may include a gate connected to a second node N2, the first terminal connected to a first node N1, and the second terminal connected to a third node N3. The first transistor T1 may receive a data signal according to the switching operation of the second transistor T2 and supply a driving current to the organic light-emitting diode OLED.

The second transistor T2 (data write transistor) may be connected between the data line DL and the first node N1, and connected to the driving voltage line PL via the fifth transistor T5. The first node N1 may be a node to which the first transistor T1 and the fifth transistor T5 are connected. The second transistor T2 may include a gate connected to the first gate line GWL, the first terminal connected to the data line DL, and the second terminal connected to the first node N1 (or the first terminal of the first transistor T1). The second transistor T2 is turned on in response to a first gate signal GW received through the first gate line GWL and may perform a switching operation of transmitting a data signal received through the data line DL to the first node N1.

The third transistor T3 (compensation transistor) may be connected between the second node N2 and the third node N3. The third transistor T3 may be connected to the organic light-emitting diode OLED via the sixth transistor T6. The second node N2 may be a node to which the gate of the first transistor T1 is connected, and the third node N3 may be a node to which the first transistor T1 and the sixth transistor T6 are connected. The third transistor T3 may include a gate connected to the second gate line GCL, the first terminal connected to the second node N2 (or the gate of the first transistor T1), and the second terminal connected to the third node N3 (or the second terminal of the first transistor T1). The third transistor T3 is turned on in response to a second gate signal GC received through the second gate line GCL and may compensate for a threshold voltage of the first transistor T1 by diode-connecting the first transistor T1.

The fourth transistor T4 (first initialization transistor) may be connected between the second node N2 and the first initialization voltage line VL1. The fourth transistor T4 may include a gate connected to the third gate line GIL, the first terminal connected to the second node N2, and the second terminal connected to the first initialization voltage line VL1. The fourth transistor T4 is turned on in response to a third gate signal GI received through the third gate line GIL and may initialize the gate of the first transistor T1 by transmitting the first initialization voltage Vint to the gate of the first transistor T1.

The fifth transistor T5 (first emission control transistor) may be connected between the driving voltage line PL and the first node N1. The sixth transistor T6 (second emission control transistor) may be connected between the third node N3 and the organic light-emitting diode OLED. The fifth transistor T5 may include a gate connected to the fourth gate line EML, the first terminal connected to the driving voltage line PL, and the second terminal connected to the first node N1. The sixth transistor T6 may include a gate connected to the fourth gate line EML, the first terminal connected to the third node N3, and the second terminal connected to the pixel electrode of the organic light-emitting diode OLED. The fifth transistor T5 and the sixth transistor T6 are simultaneously turned on in response to a fourth gate signal EM received through the fourth gate line EML, and thus, the driving current flows in the organic light-emitting diode OLED.

The seventh transistor T7 (second initialization transistor) may be connected between the organic light-emitting diode OLED and the second initialization voltage line VL2. The seventh transistor T7 may include a gate connected to the fifth gate line GBL, the first terminal connected to the second terminal of the sixth transistor T6 and the pixel electrode of the organic light-emitting diode OLED, and the third terminal connected to the second initialization voltage line VL2. The seventh transistor T7 is turned on in response to a fifth gate signal GB received through the fifth gate line GBL and may initialize the pixel electrode of the organic light-emitting diode OLED by transmitting the second initialization voltage Vaint to the pixel electrode of the organic light-emitting diode OLED.

The eighth transistor T8 (bias transistor) may be connected between the first node N1 and the bias voltage line VBL. The eighth transistor T8 may include a gate connected to the fifth gate line GBL, the first terminal connected to the bias voltage line VBL, and the second terminal connected to the first node N1. The eighth transistor T8 is turned on in response to the fifth gate signal GB received through the fifth gate line GBL and may preset a voltage suitable for a subsequent operation of the first transistor T1 by applying the bias voltage Vbias to the first terminal of the first transistor T1.

The capacitor Cst may include a first electrode and a second electrode. The first electrode may be connected to the gate of the first transistor T1, and the second electrode may be connected to the driving voltage line PL. The capacitor Cst may maintain a voltage applied to the gate of the first transistor T1 by storing and maintain a voltage corresponding to a voltage difference between the driving voltage line PL and the gate of the first transistor T1.

The organic light-emitting diode OLED may include the pixel electrode and a counter electrode, and the counter electrode may receive a common voltage ELVSS. A second power voltage ELVSS may be a low voltage supplied to the counter electrode (second electrode or cathode) of the organic light-emitting diode OLED. The organic light-emitting diode OLED may display an image by receiving a driving current IOLED from the first transistor T1 and emitting light.

According to some embodiments, at least one of the transistors T1 to T8 may include a semiconductor layer including an oxide, and the other transistors may each include a semiconductor layer. In detail, the first transistor T1, which directly affects the brightness of a display device, is configured to include a semiconductor layer including polycrystalline silicon having high reliability, and thus, a high-resolution display device may be implemented.

On the other hand, as an oxide semiconductor has a high carrier mobility and a low leakage current, even when a driving time is long, a voltage drop is not much. In other words, even when low frequency driving, as a color change of an image according to the voltage drop is not much, low frequency driving is possible. As such, as it may be desirable for the oxide semiconductor has a less leakage current, by employing at least one of the third transistor T3 or the fourth transistor T4 connected to the gate electrode of the first transistor T1, as the oxide semiconductor, a leakage current that may flow toward the gate electrode of the first transistor T1 may be prevented or reduced and simultaneously power consumption may be reduced.

Figure 3:
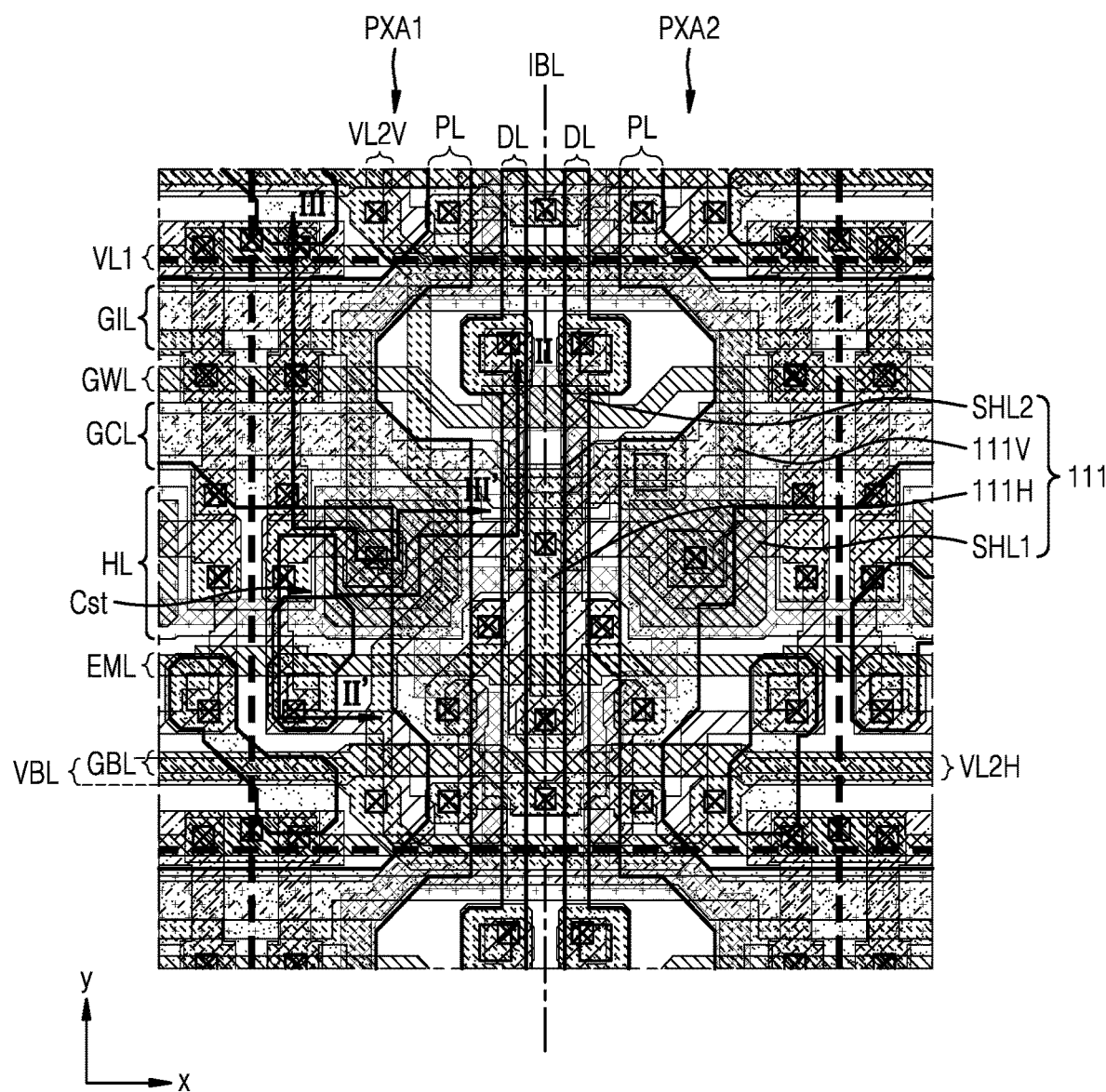
FIG. 3 is a schematic layout diagram of elements constituting a pixel according to some embodiments.
Figure 10:
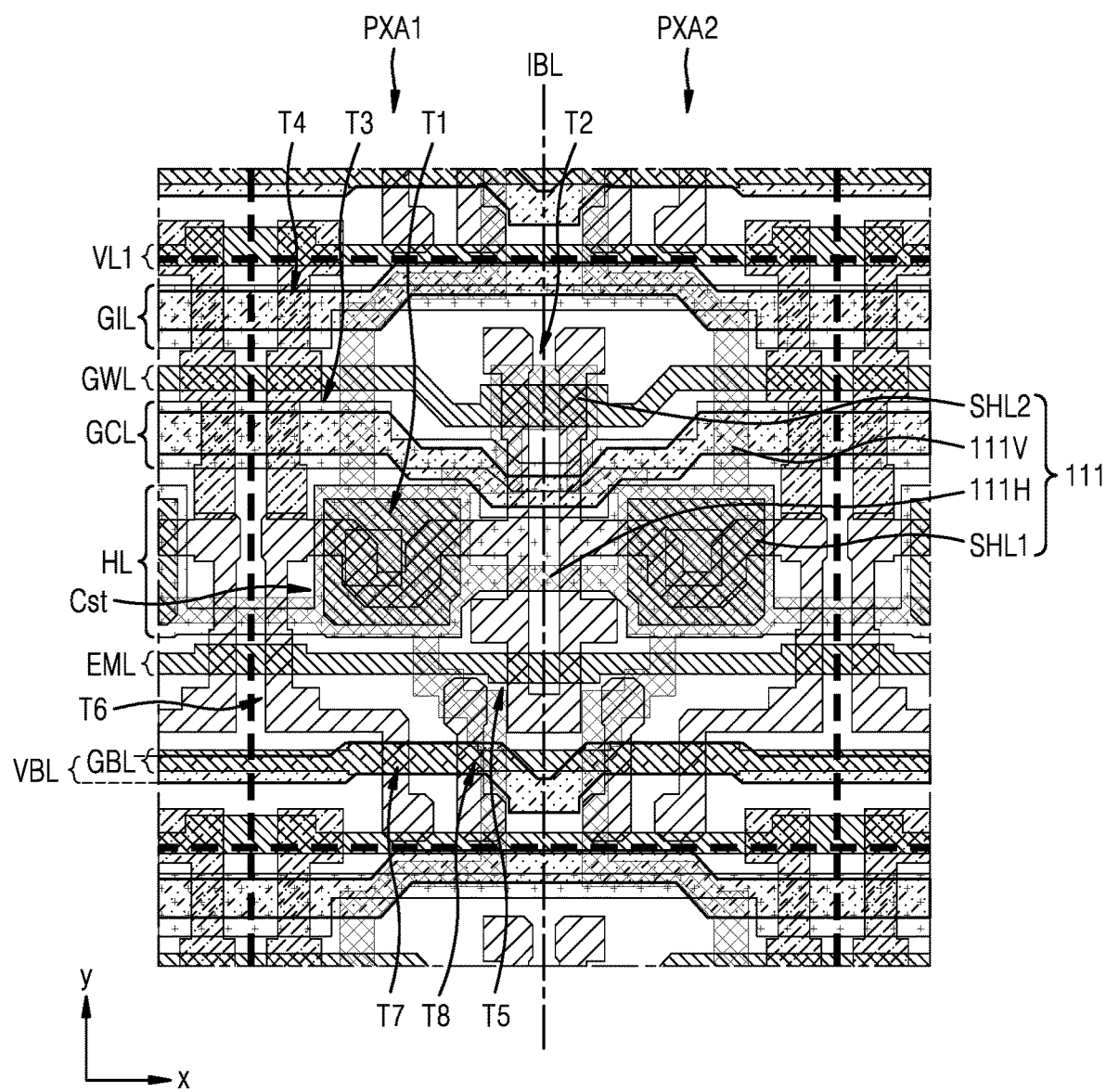
Figure 11:
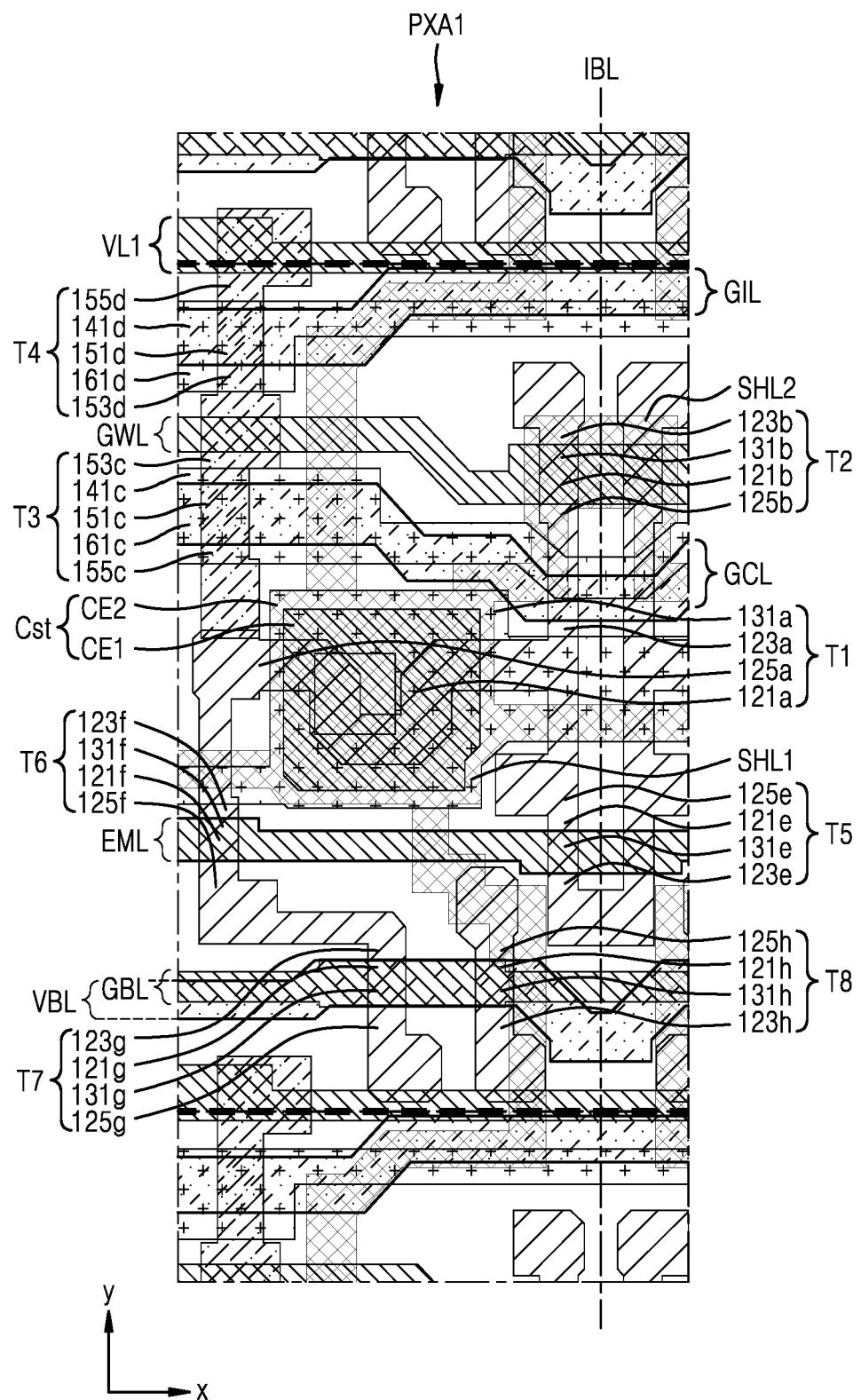
Figure 14:
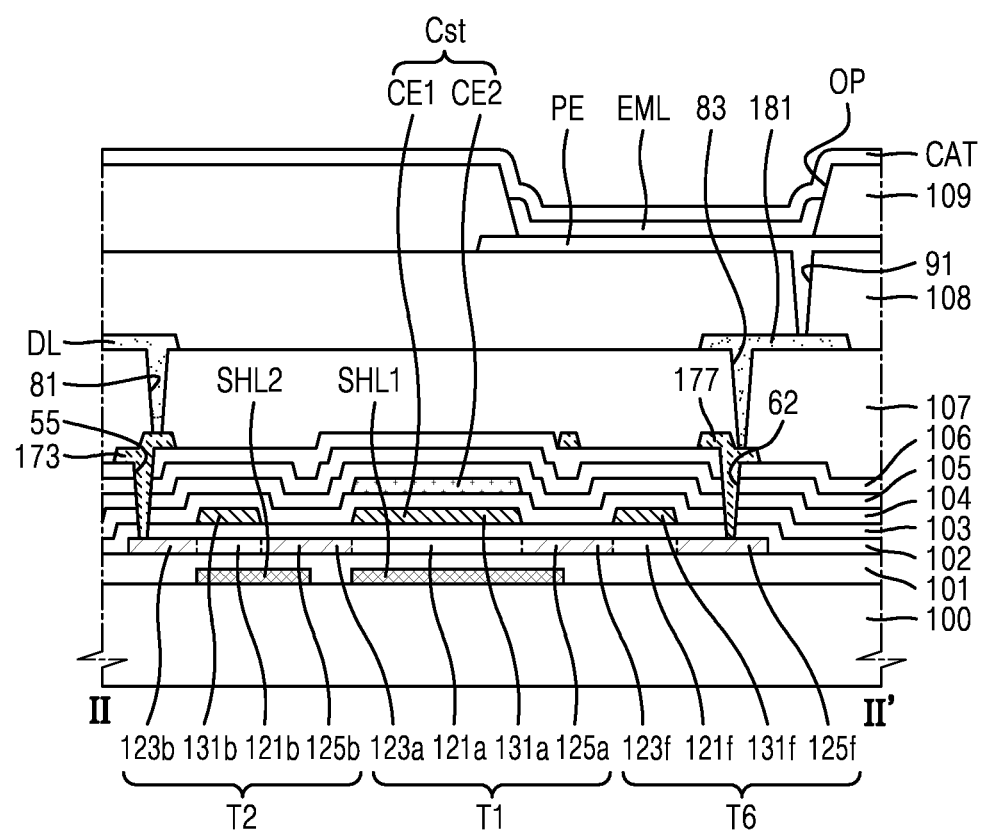
FIG. 14 is a cross-sectional view of a display panel taken along the line II-II' of FIG. 3.
Figure 15:
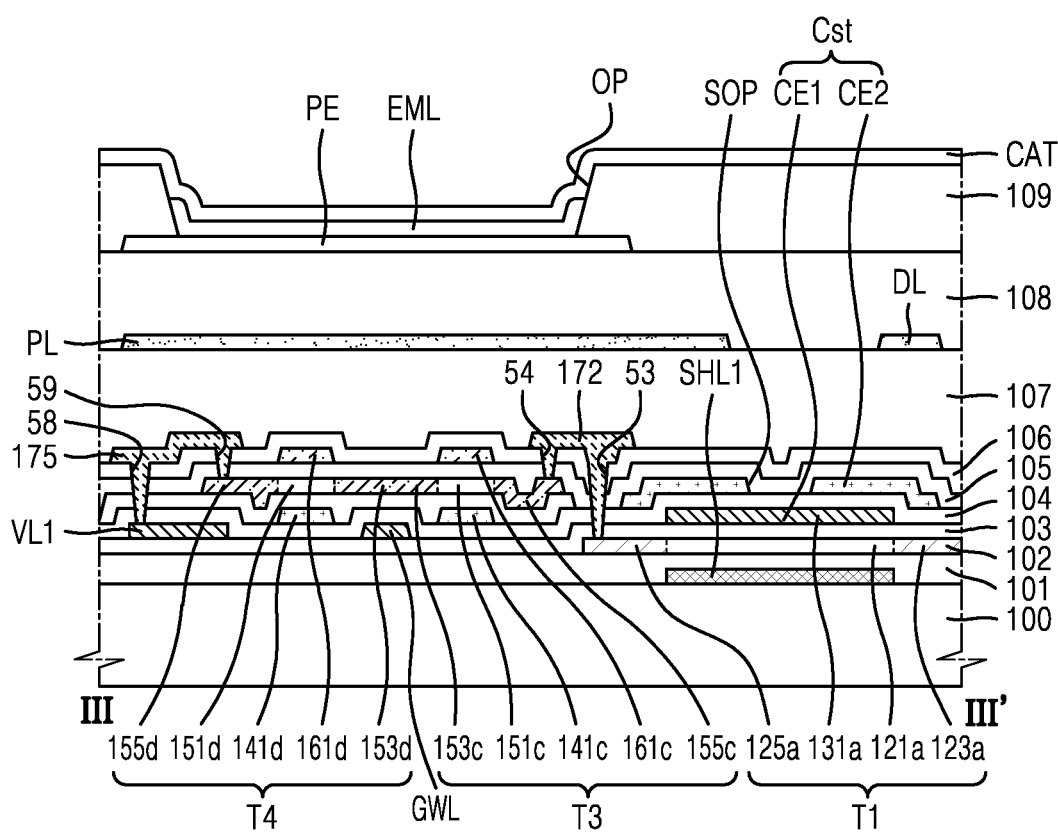
FIG. 15 is a cross-sectional view of a display panel taken along the line III-III' of FIG. 3.

FIG. 3 is a schematic layout diagram of elements constituting a pixel according to some embodiments. FIGS. 4 to 13 are schematic layout diagrams of the elements of FIG. 3 for each layer. FIG. 10 is a layout diagram showing that elements of FIGS. 4 to 9 are overlapped with one another. FIG. 11 is a layout diagram, as a part of FIG. 10, showing the first to eighth transistors T1 to T8 and the capacitor Cst of a first pixel area PXA1. FIG. 14 is a cross-sectional view of a display panel taken along line I-I' of FIG. 3. FIG. 15 is a cross-sectional view of a display panel taken along line II-II' of FIG. 3.

The display area DA defined in the substrate 100 may include a plurality of pixel areas in which a row and a column cross each other. A pixel area may be an area wherein a pixel circuit is located. The pixel area may include a pair of the first pixel area PXA1 and a second pixel area PXA2, which are adjacent to each other in an x direction. The pixel circuit located in the first pixel area PXA1 and the pixel circuit located in the second pixel area PXA2 may be line symmetrical with respect to a boundary line IBL. As the same elements are located in each layer of the first pixel area PXA1 and the second pixel area PXA2, for convenience of explanation, elements of the pixel circuit located in the first pixel area PXA1 are mainly described. Hereinafter, the description is presented with FIGS. 4 to 15.

The substrate 100 may include a glass material, a ceramic material, a metal material, or a flexible or bendable material. The substrate 100 may have a single layer structure of an organic layer or a multilayer structure of an organic layer and an inorganic layer. For example, the substrate 100 may be a stack structure of a first base layer/a barrier layer/a second base layer. The first base layer and the second base layer may each include an organic layer including polymer resin. The first base layer and the second base layer may each include transparent polymer resin. The barrier layer prevents or reduces infiltration of external foreign materials or contaminants and may have a single layer or a multilayer including an inorganic material, such as a silicon nitride (SiNx) or a silicon oxide (SiOx).

Figure 4:
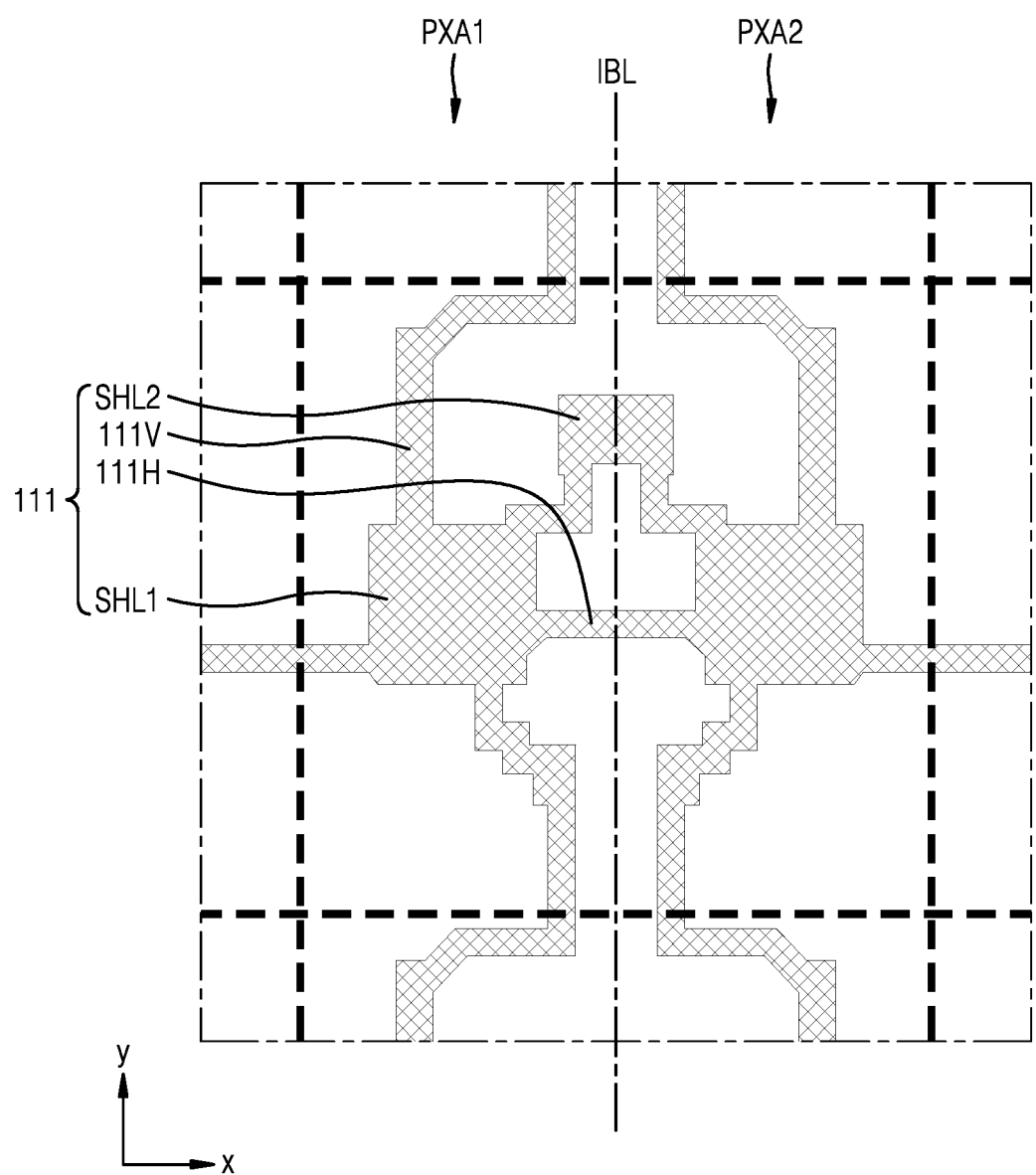
FIGS. 4 to 13 are schematic layout diagrams of the elements of FIG. 3 for each layer.

A shielding layer 111 may be located between the substrate 100 and a buffer layer 101 or between the buffer layer 101 and a first semiconductor layer SACT. As illustrated in FIGS. 4 and 11, the shielding layer 111 may include a first shielding layer SHL1 that is a portion overlapped with the first transistor T1, a second shielding layer SHL2 that is a portion overlapped with the second transistor T2, a first connection line 111H extending in the x direction, and a second connection line 111V extending in a y direction.

According to some embodiments, the first shielding layer SHL1, the second shielding layer SHL2, the first connection line 111H, and the second connection line 111V may be integrally formed as a single body. For example, the second shielding layer SHL2 may be a portion protruding and extending from the first shielding layer SHL1 in a diagonal direction, and the first connection line 111H may be a portion protruding and extending from the first shielding layer SHL1 in the x direction, and the second connection line 111V may be a portion protruding and extending from the first shielding layer SHL1 in the y direction.

The first shielding layer SHL1 is a shielding pattern corresponding to a gate electrode 131a of the first transistor T1, is greater than the gate electrode 131a of the first transistor T1, and may be completely overlapped with the gate electrode 131a of the first transistor T1. The second shielding layer SHL2 is a shielding pattern corresponding to a gate electrode 131b of the second transistor T2, is greater than the gate electrode 131b of the second transistor T2, and may be completely overlapped with the gate electrode 131b of the second transistor T2. The planar area of the first shielding layer SHL1 may be greater than the planar area of the gate electrode 131a of the first transistor T1. The planar area of the second shielding layer SHL2 may be greater than the planar area of the gate electrode 131b of the second transistor T2. The first shielding layer SHL1 may be overlapped with at least a channel region 121a of the first transistor T1, and the second shielding layer SHL2 may be overlapped with at least a channel region 121b of the second transistor T2.

Although the first shielding layer SHL1 and the second shielding layer SHL2 are illustrated to have a rectangular shape when viewed on a plane, the disclosure is not limited thereto, and the first shielding layer SHL1 and the second shielding layer SHL2 may have various shapes, such as a polygon, a polygon with round corners, a circle, an oval, and the like.

The second shielding layer SHL2 of the first pixel area PXA1 and the second shielding layer SHL2 of the second pixel area PXA2 may be connected to each other. For example, the second shielding layer SHL2 of the first pixel area PXA1 and the second shielding layer SHL2 of the second pixel area PXA2 may be integrally formed. In the shielding layer 111, a portion connecting the first shielding layer SHL1 with the second shielding layer SHL2 may overlap a drain region 125b of the second transistor T2. The first connection line 111H may connect the first shielding layers SHL1 of the pixel areas adjacent to each other in the x direction. The second connection line 111V may connect the first shielding layers SHL1 of the pixel areas adjacent to each other in the y direction. Accordingly, the shielding layer 111 may have a mesh structure in the display area DA. The first connection line 111H and the second connection line 111V may extend by being bent. As the first shielding layer SHL1 and the second shielding layer SHL2 are connected to each other, the first connection line 111H may connect the second shielding layers SHL2 of the pixel areas adjacent to each other in the x direction, and the second connection line 111V may connect the second shielding layers SHL2 of the pixel areas adjacent to each other in the y direction.

As external light arrives at the first transistor T1, a light afterimage phenomenon may occur. In this case, the device characteristics of the first transistor T1, for example voltage-current characteristics, may be changed, and a degree of a change in the voltage-current characteristics of the first transistor T1 may vary depending on the intensity of light arrived at the first transistor T1, the exposure time to light, and the like. This may prevent the precise control of a gradation of light emitted from the display element, so that light of a gradation that is not desired by the display element. According to some embodiments, the first shielding layer SHL1 overlapped with the semiconductor layer of the first transistor T1 is located under the first transistor T1, for example, below the semiconductor layer of the first transistor T1, to reduce the first transistor T1 from being affected by light and to have stable voltage-current characteristics, thereby preventing or reducing degradation of display quality.

Furthermore, mobile charges are induced in an organic layer (for example, the second base layer) of the substrate 100 by a voltage varying during driving of a display device, and a back channel may be formed below the semiconductor layer of the driving transistor and may affect the characteristics of the driving transistor. For example, in FIG. 3, when a (−) voltage is applied to both of the fourth gate line EML located around the first transistor T1 and the second gate line GCL for controlling the third transistor T3, that is an oxide-based transistor, in a plane, (+) charges may be gathered in an interface of the second base layer. Accordingly, an electric field may be formed, and thus, (−) charges may be gathered below the semiconductor layer of the first transistor T1. Accordingly, the back channel is formed below the semiconductor layer of the first transistor T1, and thus, the voltage-current characteristics of the first transistor T1 may be changed. According to some embodiments, as the first shielding layer SHL1 overlapped with the semiconductor layer of the first transistor T1 is located under the first transistor T1, for example, below the semiconductor layer of the first transistor T1, an electric field that may affect the first transistor T1 may be effectively shielded.

On the other hand, as a charge charging phenomenon occurs in the semiconductor layer of the second transistor T2 by external static electricity, as the threshold voltage of the second transistor T2 is shifted in a positive direction, leakage may occur in the second transistor T2. For example, as (−) charges are gathered below the semiconductor layer of the second transistor T2 by external static electricity, (+) charges are induced in the semiconductor layer of the second transistor T2, and thus, the threshold voltage of the second transistor T2 may be moved in a positive direction. As the charges charged in the data line is lost as the leakage of the second transistor T2, charges moved to the gate of the first transistor T1 may be reduced. Accordingly, as the gate voltage of the first transistor T1 decreases, the gate-source voltage of the first transistor T1 increases so that a driving current may be increased. As a pixel emit light with a luminance different form a set luminance, a stain phenomenon may occur in an image. According to some embodiments, as the second shielding layer SHL2 overlapped with the semiconductor layer of the second transistor T2 is located below the second transistor T2, for example, below the semiconductor layer of the second transistor T2, the charge charging of the semiconductor layer occurring by the external static electricity is prevented or reduced, and thus, the characteristic change of the second transistor T2 may be reduced.

According to some embodiments, the shielding layer 111 may include amorphous silicon, for example, amorphous silicon doped with impurities. In an example, the shielding layer 111 may include p-type amorphous silicon obtained by doping impurities, such as aluminum (Al), boron (B), indium (In), or the like, in pure amorphous silicon. In another example, the shielding layer 111 may include n-type amorphous silicon obtained by doping impurities, such as phosphor (P), arsenic (As), antimony (Sb), or the like, in pure amorphous silicon. The shielding layer 111, which includes impurity-doped amorphous silicon, may have a relatively low light transmittance. The shielding layer 111, which includes amorphous silicon, may be relatively electrically stabilized without receiving a separate constant voltage. According to some embodiments, the shielding layer 111 may include a metal material, such as chromium (Cr), molybdenum (Mo), or the like, black ink and/or dye, and the like.

According to some embodiments, a barrier layer may be further included between the substrate 100 and the buffer layer 101. The barrier layer may be a single layer or multilayer including an inorganic material, such as silicon a nitride (SiNx) or a silicon oxide (SiOx).

Figure 5:
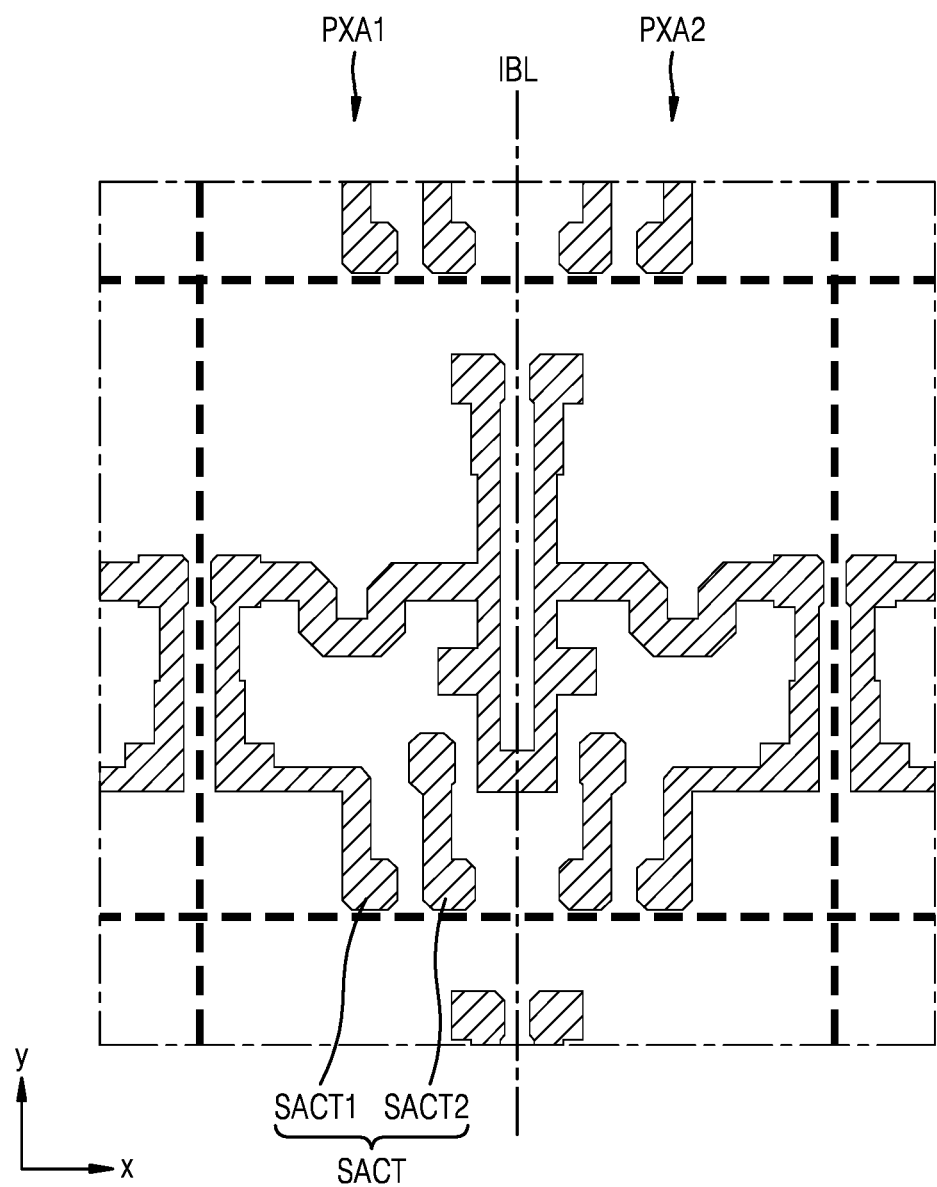

The buffer layer 101 may be located on the shielding layer 111, and as illustrated in FIG. 5, the first semiconductor layer SACT may be located on the buffer layer 101. The first semiconductor layer SACT may include a silicon semiconductor. The first semiconductor layer SACT may include a first sub-semiconductor layer SACT1 and a second sub-semiconductor layer SACT2 separated from the first sub-semiconductor layer SACT1. The first sub-semiconductor layer SACT1 of the first pixel area PXA1 may be integrally connected with the first sub-semiconductor layer SACT1 of the second pixel area PXA2. The second sub-semiconductor layer SACT2 may be electrically connected to the first sub-semiconductor layer SACT1, as described below.

The first sub-semiconductor layer SACT1 may have a shape bent in various shapes. The first sub-semiconductor layer SACT1 may include a channel region, and a source region and a drain region in both sides of each of the channel region, of the first transistor T1, the second transistor T2, the fifth transistor T5, the sixth transistor T6, and the seventh transistor T7. The second sub-semiconductor layer SACT2 may include a channel region, and a source region and a drain region, of the eighth transistor T8.

Referring to FIG. 11, the first sub-semiconductor layer SACT1 includes the channel region 121a, a source region 123a, and a drain region 125a of the first transistor T1, the channel region 121*b*, a source region 123*b*, and the drain region 125*b* of the second transistor T2, a channel region 121*e*, a source region 123*e*, and a drain region 125*e* of the fifth transistor T5, a channel region 121*f*, a source region 123*f*, and a drain region 125*f* of the sixth transistor T6, and a channel region 121*g*, a source region 123*g*, and a drain region 125*g* of the seventh transistor T7. The second sub-semiconductor layer SACT2 may include a channel region 121*h*, a source region 123*h*, and a drain region 125*h* of the eighth transistor T8.

Figure 6:
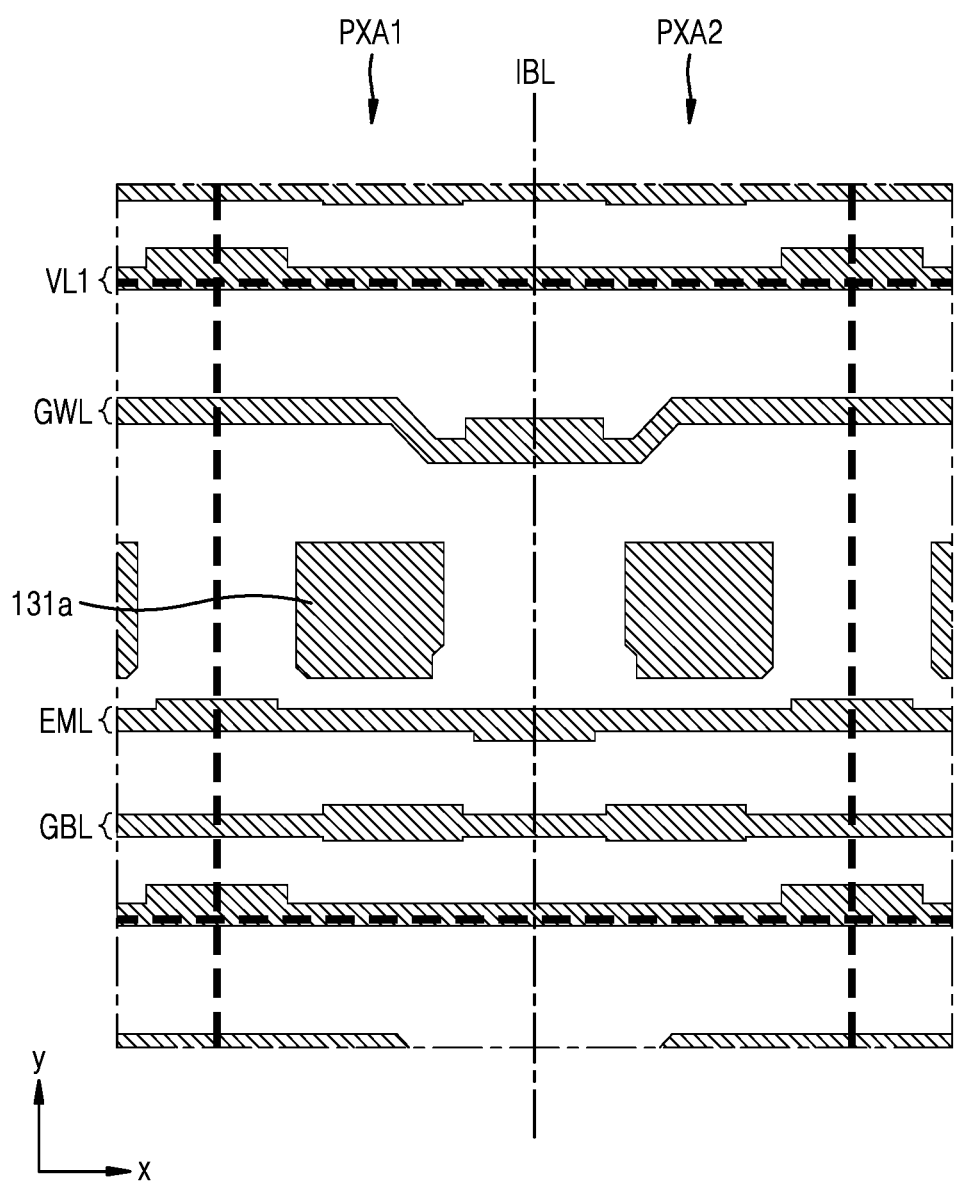

A first insulating layer 102 may be located on the buffer layer 101 covering first semiconductor layer SACT, as illustrated in FIG. 6, the gate electrode 131*a* of the first transistor T1 may be formed or arranged in an island shape on the first insulating layer 102, and the first initialization voltage line VL1, the first gate line GWL, the fourth gate line EML, and the fifth gate line GBL may be arranged by extending in the x direction.

Referring to FIG. 11, the gate electrode 131*a* of the first transistor T1 may be a lower electrode CE1 that is the first electrode of the capacitor Cst. The gate electrode 131*b* of the second transistor T2 may be a part of the first gate line GWL that crosses (overlaps) the first sub-semiconductor layer SACT1. A gate electrode 131*e* of the fifth transistor T5 and a gate electrode 131*f* of the sixth transistor T6 may be parts of the fourth gate line EML that crosses the first sub-semiconductor layer SACT1. A gate electrode 131*g* of the seventh transistor T7 may be a part of the fifth gate line GBL that crosses the first sub-semiconductor layer SACT1. A gate electrode 131*h* of the eighth transistor T8 ma be a part of the fifth gate line GBL that crosses the second sub-semiconductor layer SACT2.

Figure 7:
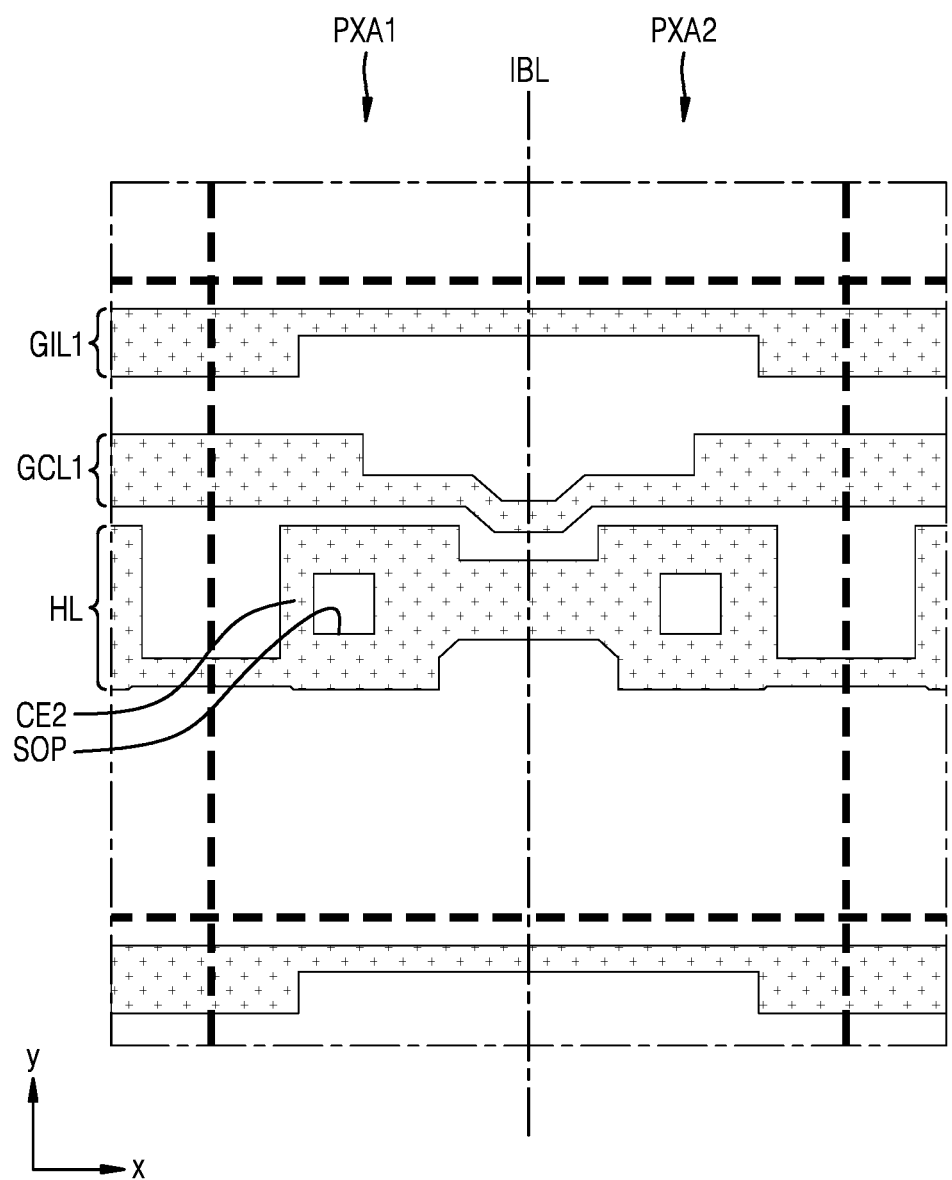

A second insulating layer 103 may be located on the first insulating layer 102, and, as illustrated in FIG. 7, an electrode voltage line HL, a lower gate line GCL1 of the second gate line GCL, and a lower gate line GIL1 of the third gate line GIL may be arranged by extending in the x direction on the second insulating layer 103.

A part of the electrode voltage line HL, which is an upper electrode CE2 that is the second electrode of the capacitor Cst, may cover the lower electrode CE1 of the capacitor Cst. The upper electrodes CE2 of the capacitors Cst of the pixel circuits in the same row may be connected to each other by the electrode voltage line HL. An opening SOP may be formed in the upper electrode CE2 of the capacitor Cst.

Figure 8:
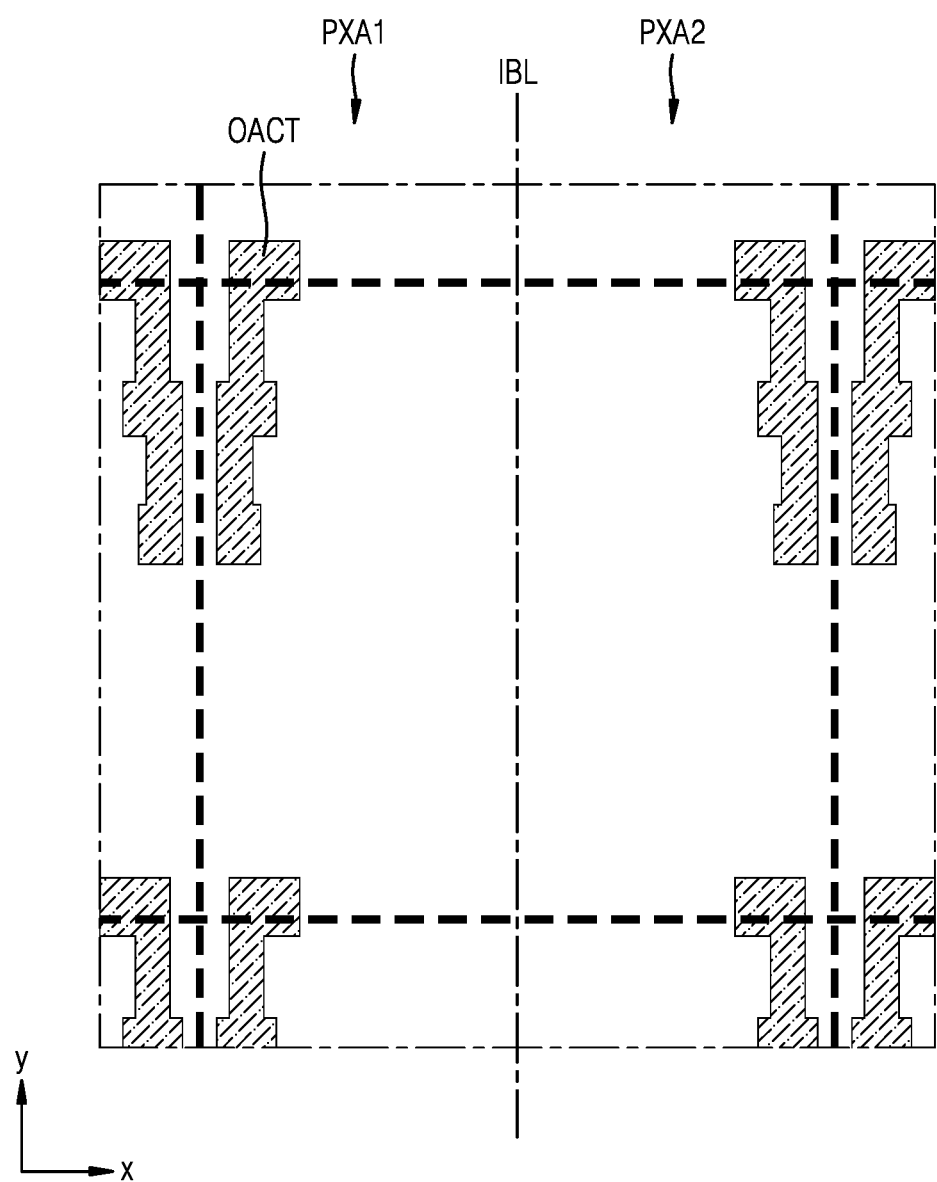

A third insulating layer 104 may be located on the second insulating layer 103, and as illustrated in FIG. 8, a second semiconductor layer OACT may be located on the third insulating layer 104. The second semiconductor layer OACT may include an oxide semiconductor. The second semiconductor layer OACT may include the channel region, the source region, and the drain region of each of the third transistor T3 and the fourth transistor T4.

Referring to FIG. 11, the second semiconductor layer OACT may include a channel region 151*c*, a source region 153*c*, and a drain region 155*c* of the third transistor T3, and a channel region 151*d*, a source region 153*d*, and a drain region 155*d* of the fourth transistor T4.

In other words, it may be understood that the channel region, the source region, and the drain region of each of the first to eighth transistors T1 to T8 may be partial areas of the semiconductor layer. The source region and the drain region of the semiconductor layer may respectively correspond to the first terminal (or the second terminal) and the second terminal (or the first terminal) of the transistor described with reference to FIG. 2. It may be interpreted that the source region or the drain region are the source electrode or the drain electrode of a transistor in some cases. For example, the source electrode and the drain electrode of the first transistor T1 respectively correspond to the source region 123*a* and the drain region 125*a* that are doped with impurities in the vicinity of the channel region 121*a*.

Figure 9:
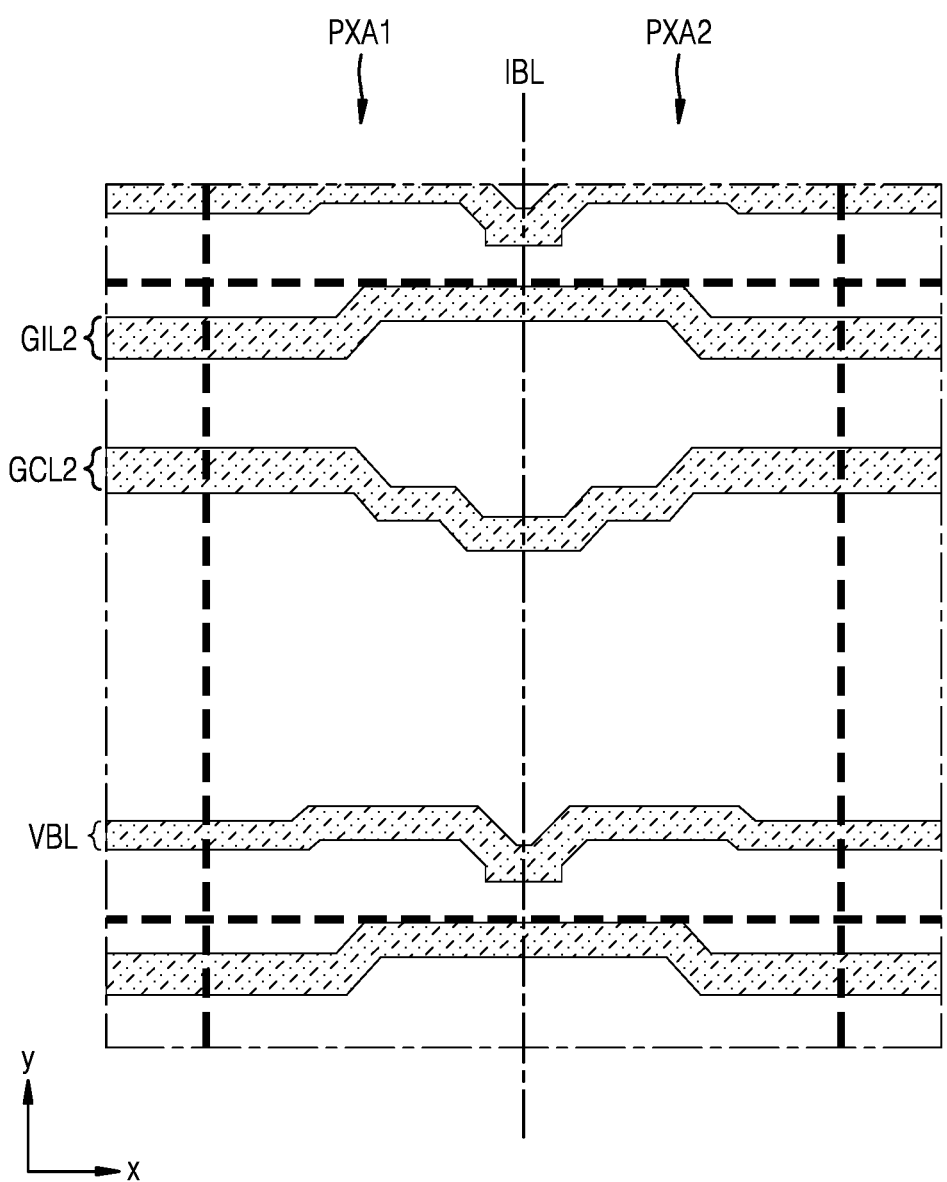

A fourth insulating layer 105 may be located on the third insulating layer 104, and, as illustrated in FIG. 9, an upper gate line GCL2 of the second gate line GCL, an upper gate line GIL2 of the third gate line GIL and the bias voltage line VBL in the x direction may be arranged by extending on the fourth insulating layer 105.

Referring to FIG. 11, the gate electrode of the third transistor T3 and the gate electrode of the fourth transistor T4 may be parts of the second gate line GCL and the third gate line GIL crossing (overlapping) the second semiconductor layer OACT. The gate electrode of the third transistor T3 may include a lower gate electrode 141*c* that is a part of the lower gate line GCL1 of second gate line GCL and an upper gate electrode 161*c* that is a part of the upper gate line GCL2. The gate electrode of the fourth transistor T4 may include a lower gate electrode 141*d* that is a part of the lower gate line GIL1 of the third gate line GIL and an upper gate electrode 161*d* that is a part of the upper gate line GIL2. In other words, the third transistor T3 and the fourth transistor T4 may have a dual gate structure in which control electrodes are respectively provided above and below the second semiconductor layer OACT.

The bias voltage line VBL may overlap the fifth gate line GBL.

Figure 12:
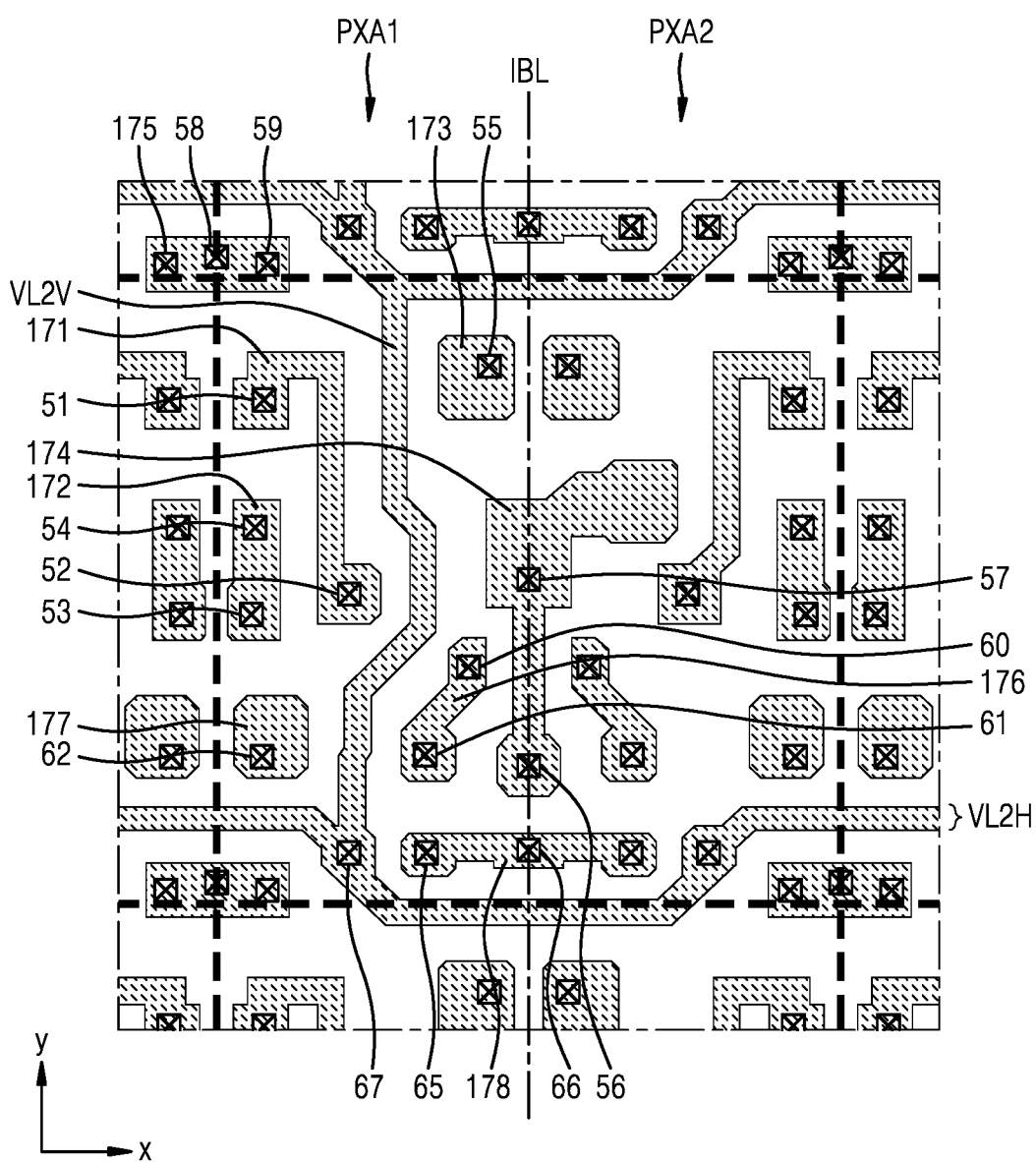

A fifth insulating layer 106 may be located on the fourth insulating layer 105, and as illustrated in FIG. 12, the second initialization voltage line VL2 may be located on the fifth insulating layer 106. Furthermore, connection electrodes 171 to 178 may be located on the fourth insulating layer 105.

The second initialization voltage line VL2 may include a horizontal line VL2H extending in in the x direction and a vertical line VL2V extending in the y direction. The second initialization voltage line VL2 may be electrically connected to the drain region 125*g* of the seventh transistor T7 via a contact hole 67 that penetrates the first to fourth insulating layers 102 to 105. According to some embodiments, the vertical line VL2V of the second initialization voltage line VL2 may be provided only in an area of one (for example, the first pixel area PXA1) of a pair of the first pixel area PXA1 and the second pixel area PXA2. A part of the horizontal line VL2H may overlap the third gate line GIL, the fifth gate line GBL, and the bias voltage line VBL. A part of the vertical line VL2V may overlap a first electrode CE1 and a second electrode CE2 of the capacitor Cst.

One end of the connection electrode 171 may be electrically connected to the second semiconductor layer OACT by contacting the second semiconductor layer OACT via a contact hole 51. The one end of the connection electrode 171 may be electrically connected to the source region 153*c* of the third transistor T3 and the drain region 155*d* of the fourth transistor T4 via the contact hole 51 that penetrates the fourth and fifth insulating layers 105 and 106. The other end of the connection electrode 171 may be electrically connected to the gate electrode 131*a* of the first transistor T1 via a contact hole 52 that penetrates the second to fifth insulating layers 103 to 106. On the other hand, the contact hole 52 may be arranged to be spaced apart from an edge of the opening SOP in the opening SOP of the second electrode CE2 of the capacitor Cst, and thus, the connection electrode 171 may be electrically insulated from the second electrode CE2.

A connection electrode 172 may be electrically connected to the drain region 125a of the first transistor T1 and the source region 123f of the sixth transistor T6 via a contact hole 53 that penetrates the first to fifth insulating layers 102 to 106. The connection electrode 172 may be electrically connected to the drain region 155c of the third transistor T3 via a contact hole 54 that penetrates the fourth and fifth insulating layers 105 and 106.

A connection electrode 173 may be electrically connected to the source region 123b of the second transistor T2 via a contact hole 55 that penetrates the first to fifth insulating layers 102 to 106.

A connection electrode 174 may be electrically connected to the source region 123e of the fifth transistor T5 via a contact hole 56 that penetrates the first to fifth insulating layers 102 to 106. The connection electrode 174 may be electrically connected to the electrode voltage line HL via a contact hole 57 that penetrates the third to fifth insulating layers 104 to 106.

A connection electrode 175 may be electrically connected to the first initialization voltage line VL1 via a contact hole 58 that penetrates the second to fifth insulating layers 103 to 106. The connection electrode 175 may be electrically connected to the drain region 155d of the fourth transistor T4 via a contact hole 59 that penetrates the fourth and fifth insulating layers 105 and 106.

A connection electrode 176 may be electrically connected to the source region 123a of the first transistor T1 and the drain region 125e of the fifth transistor T5 via a contact hole 60 that penetrates the first to fifth insulating layers 102 to 106. The connection electrode 176 may be electrically connected to the drain region 125h of the eighth transistor T8 via a contact hole 61 that penetrates the first to fifth insulating layers 102 to 106.

A connection electrode 177 may be electrically connected to the drain region 125f of the sixth transistor T6 via a contact hole 62 that penetrates the first to fifth insulating layers 102 to 106.

A connection electrode 178 may be electrically connected to the source region 123h of the eighth transistor T8 via a contact hole 65 that penetrates the first to fifth insulating layers 102 to 106. The connection electrode 178 may be electrically connected to the bias voltage line VBL via a contact hole 66 that penetrates the fifth insulating layer 106.

Figure 13:
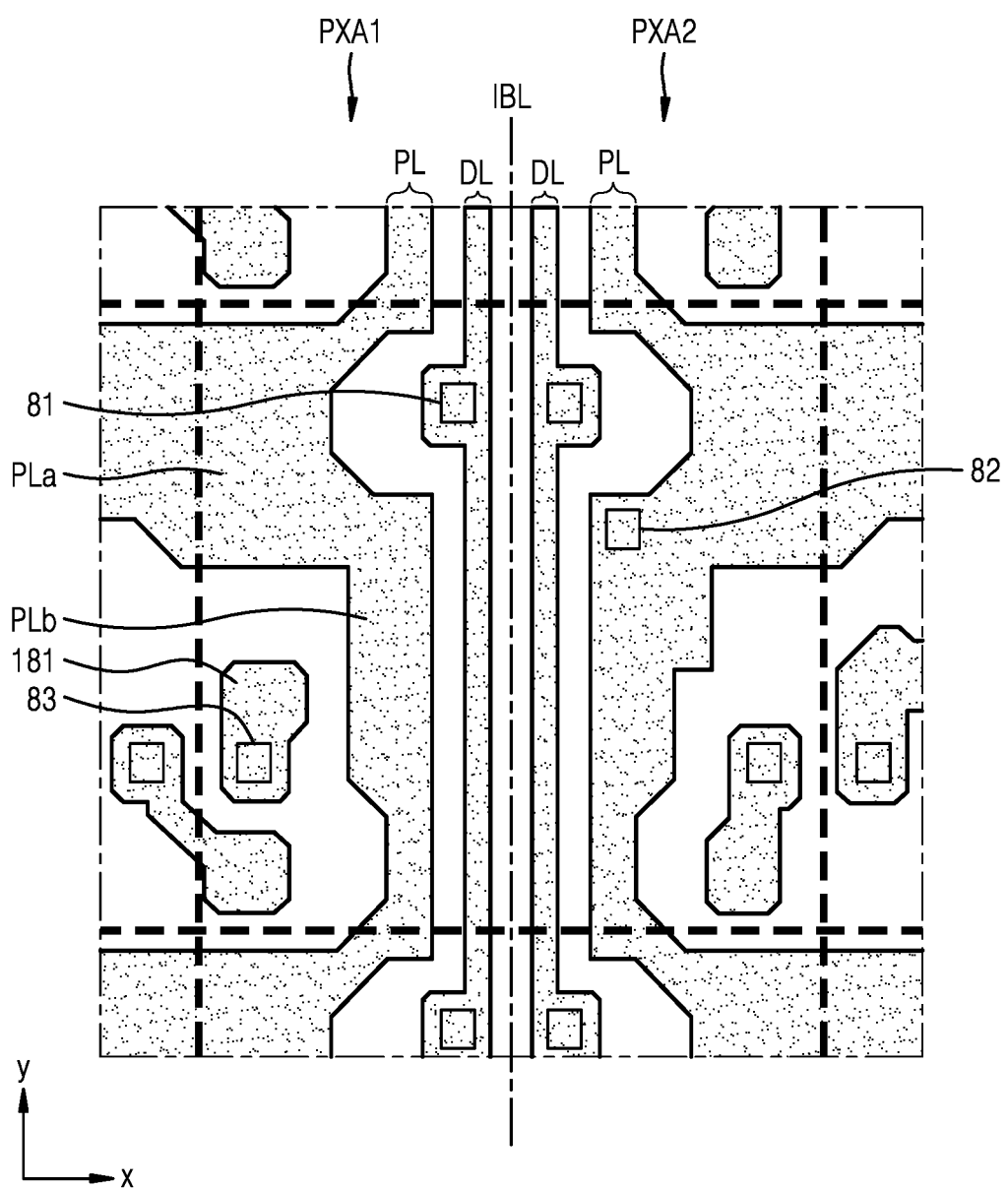

A sixth insulating layer 107 may be located on the fifth insulating layer 106, as illustrated in FIG. 13, a connection electrode 181 may be located on the sixth insulating layer 107, and the data line DL and the driving voltage line PL may be arranged by extending in the y direction.

The data line DL is electrically connected to the connection electrode 173 via a contact hole 81 that penetrates the sixth insulating layer 107, and may be electrically connected to the source region 123b of the second transistor T2.

The driving voltage line PL may include a first part PLa having an approximately rectangular shape and arranged across a pair of the first pixel area PXA1 and the second pixel area PXA2 adjacent to each other in the x direction and a second part PLb having an approximately linear shape extending in the y direction. The first part PLa of the driving voltage line PL in the second pixel area PXA2 may be electrically connected to the connection electrode 174 via a contact hole 82 that penetrates the sixth insulating layer 107. Accordingly, the driving voltage line PL extending in the y direction is connected to the electrode voltage line HL extending in the x direction, and thus, the driving voltage line PL may have a mesh structure.

The connection electrode 181 is electrically connected to the connection electrode 172 via a contact hole 83 that penetrates the sixth insulating layer 107, and may be electrically connected to the source region 123f of the sixth transistor T6.

As illustrated in FIGS. 14 and 15, a seventh insulating layer 108 may be located on the sixth insulating layer 107, and a pixel electrode PE may be located on the seventh insulating layer 108. The pixel electrode PE is electrically connected to the connection electrode 181 via a contact hole 91 that penetrates the seventh insulating layer 108, and may be electrically connected to the first transistor T1 via the sixth transistor T6.

An eighth insulating layer 109 that is a pixel defining layer may be located on the pixel electrode PE. The eighth insulating layer 109, which has an opening OP corresponding to a light-emitting area of each pixel, may define a pixel. A light-emitting layer EML is located in the opening OP of the eighth insulating layer 109, and a counter electrode CAT may be located on the light-emitting layer EML. The pixel electrode PE, the light-emitting layer EML, and the counter electrode CAT may constitute an organic light-emitting diode OLED. The counter electrode CAT is integrally formed in a plurality of organic light-emitting diodes OLEDs, and may correspond to the pixel electrodes PE. According to some embodiments, at least one functional layer may be further located on an upper layer and/or a lower layer of the light-emitting layer EML.

A thin film encapsulation layer or a sealing substrate is located above the organic light-emitting diode OLED to cover and protect the organic light-emitting diode OLED. The thin film encapsulation layer may include an inorganic encapsulation layer including at least one inorganic material and an organic encapsulation layer including at least one organic material. In some embodiments, the thin film encapsulation layer may have a structure in which a first inorganic encapsulation layer/an organic encapsulation layer/a second inorganic encapsulation layer are staked.

Figure 16:
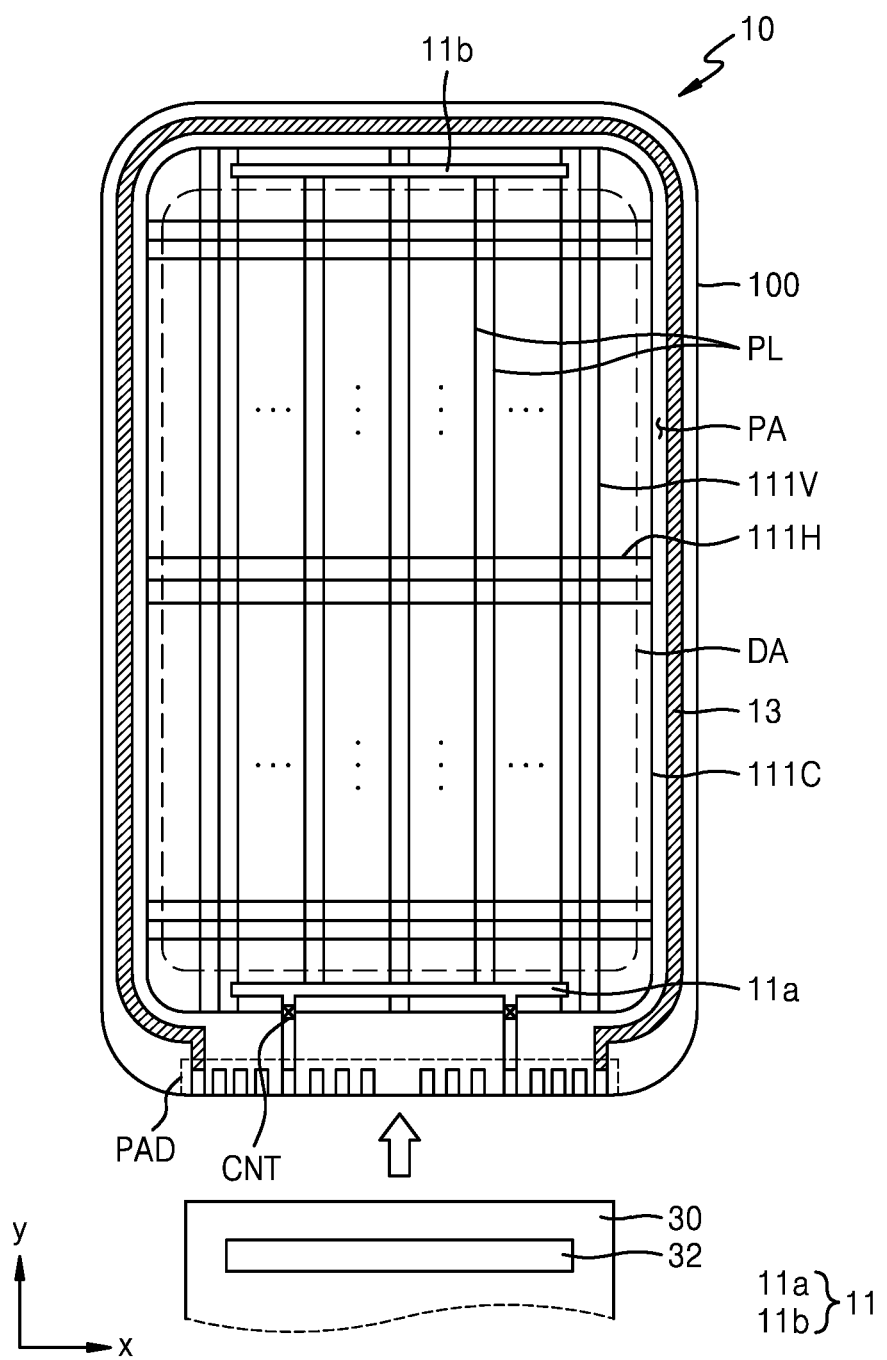
FIGS. 16 and 17 are schematic views showing a connection relation of wirings located in a display area and a peripheral area, according to some embodiments.
Figure 17:
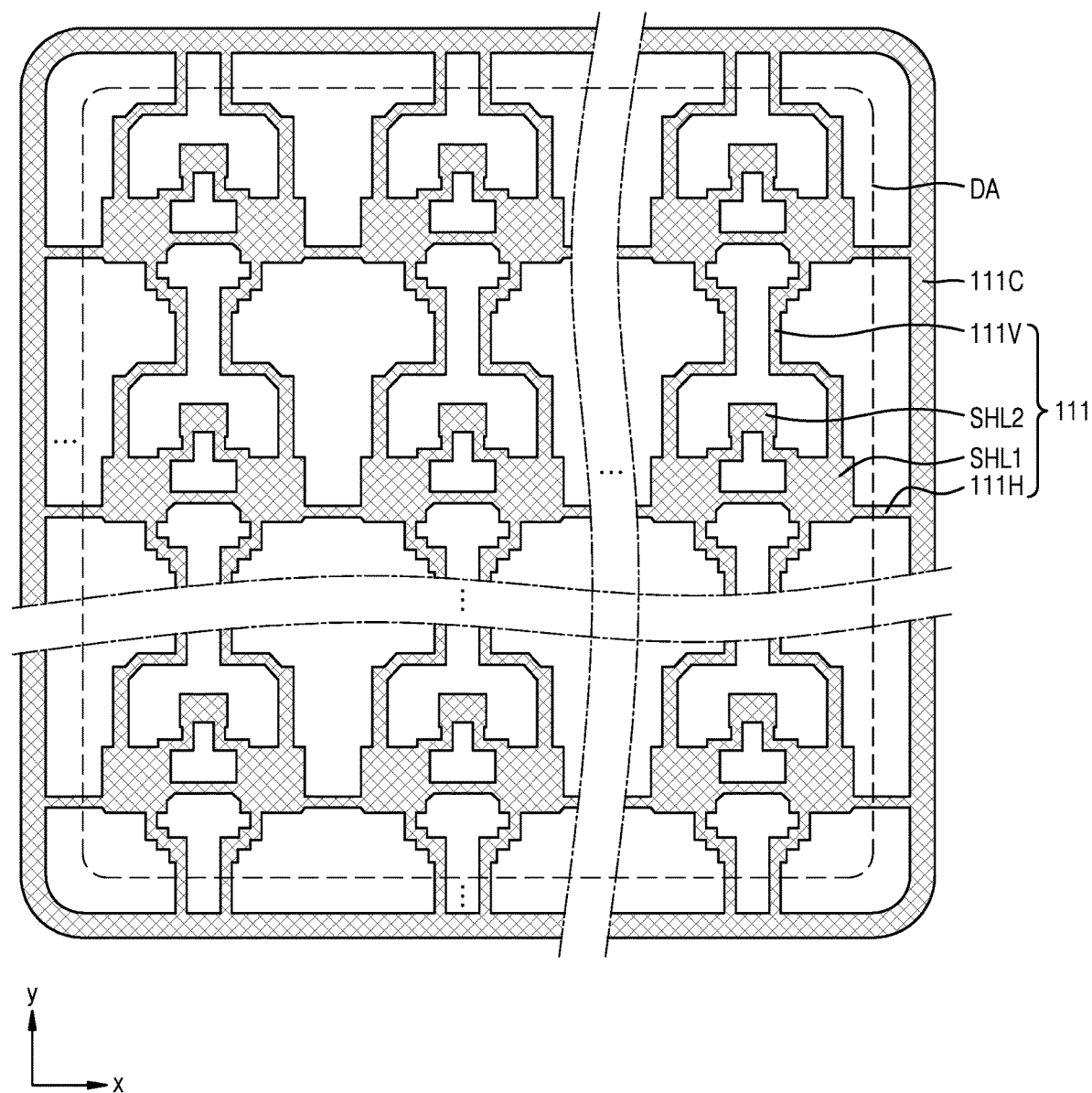

FIGS. 16 and 17 are schematic views showing a connection relation of wirings located in a display area and a peripheral area, according to some embodiments.

Referring to FIG. 16, various wirings for transmitting electrical signals to be applied to the display area DA, terminals PAD connected to the wirings and transmitting a signal applied from the outside to the wiring, and a scan driver may be located in the peripheral area PA. The various wirings for transmitting electrical signals may include a driving voltage supply line 11, a common voltage supply line 13, and an outer line 111C.

The scan driver may be located in the left and/or right of the peripheral area PA to supply a gate signal to gate lines. The scan driver may partially overlap the wirings located in the peripheral area PA.

The terminals PAD may be located in one side of the substrate 100. The terminals PAD may be connected to a display circuit board 30 as being exposed without being covered by the insulating layer. A display driving circuit 32 may be located on the display circuit board 30. The display driving circuit 32 may be formed in the form of one or more integrated circuit chips and mounted on the display circuit board 30.

The display driving circuit 32 may generate a control signal to be transmitted to the scan driver. The display driving circuit 32 may generate data signals, and the generated data signals may be transmitted to the pixel circuits of the pixels PX via the data lines.

The display driving circuit 32 may supply the driving voltage ELVDD to the driving voltage supply line 11, and supply the common voltage ELVSS to the common voltage supply line 13. The driving voltage ELVDD may be applied to the pixel circuits of the pixels PX via the driving voltage line PL connected to the driving voltage supply line 11, and the common voltage ELVSS may be applied to the counter electrodes of the display elements via the common voltage supply line 13.

The driving voltage supply line 11 may include a first driving voltage supply line 11a and a second driving voltage supply line 11b. The first driving voltage supply line 11a may be connected to the terminal PAD, and may extend in the x direction under the display area DA. The second driving voltage supply line 11b may be further provided above the display area DA by extending in the x direction. The first driving voltage supply line 11a and the second driving voltage supply line 11b may be connected to the driving voltage line PL of the display area DA.

The common voltage supply line 13 may be connected to the terminal PAD, may have a loop shape with one open side, and may partially surround the display area DA.

The outer line 111C may have a loop shape and surround the display area DA. The outer line 111C may be electrically connected to the first driving voltage supply line 11a in a contact portion CNT, and may be configured to receive the driving voltage ELVDD from the first driving voltage supply line 11a. The outer line 111C may be connected to the shielding layer 111 located in the display area DA. The outer line 111C may be connected to the first connection line 111H and the second connection line 111V of the shielding layer 111 in the peripheral area PA, and may be configured to input the driving voltage ELVDD supplied from the driving voltage supply line 11 to the shielding layer 111. According to some embodiments, as illustrated in FIG. 17, the outer line 111C located in the peripheral area PA and the shielding layer 111 located in the display area DA may be integrally formed as a single body. The first shielding layer SHL1 and the second shielding layer SHL2 may be provided for each pixel area. The first connection line 111H may extend in the x direction to be arranged for each row, and the second connection line 111V may extend in the y direction to be arranged for each column. The driving voltage line PL may partially overlap the shielding layer 111.

As a constant voltage, for example, the driving voltage ELVDD, is applied to the shielding layer 111, the shielding layer 111 does not electrically float, and the electrical characteristics of the transistors, for example, the first transistor T1 and the second transistor T2, on the shielding layer 111 may be stabilized. A capacitor may be formed by a mutually overlapping area between the gate electrode 131a of the first transistor T1 and the first shielding layer SHL1 to which the driving voltage ELVDD is applied. Accordingly, the capacity of the capacitor Cst may be increased.

According to one or more embodiments, as a pixel circuit for driving a display element includes a silicon-based transistor and an oxide-based transistor, a high-resolution display device with low power consumption may be provided. Furthermore, as a shielding layer is provided below a silicon-based transistor (for example, the first transistor T1 that is a driving transistor and the second transistor T2 for writing a data signal) shielding layer, the device characteristics of a transistor may be further stabilized, and a display device with improved display quality may be provided.

According to one or more embodiments, by providing a shielding layer below a transistor, the device characteristics of the transistor may be further stabilized, and a display device with relatively improved display quality may be provided. The scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
    a substrate having a display area and a peripheral area surrounding the display area, the display area including a pixel area in which a row and a column cross each other;
    a first thin film transistor in the pixel area, between a driving voltage line and a display element, and including a first semiconductor layer and a first gate electrode overlapped with the first semiconductor layer;
    a second thin film transistor in the pixel area, between a data line and the first thin film transistor, and including a second semiconductor layer and a second gate electrode overlapped with the second semiconductor layer; and
    a first shielding layer between the substrate and the second semiconductor layer and overlapped with the second semiconductor layer.

2. The display panel of claim 1, further comprising:
    a first connection line connecting the first shielding layer of pixel areas adjacent to each other in a row direction; and
    a second connection line connecting the first shielding layer of the pixel areas adjacent to each other in a column direction.

3. The display panel of claim 1, further comprising a second shielding layer between the substrate and the first semiconductor layer and overlapped with the first semiconductor layer.

4. The display panel of claim 3, wherein the first semiconductor layer and the second semiconductor layer each include a silicon semiconductor.

5. The display panel of claim 3, wherein the first shielding layer is connected with the second shielding layer.

6. The display panel of claim 3, further comprising:
    a first connection line connecting the second shielding layer of the pixel areas adjacent to each other in a row direction; and
    a second connection line connecting the second shielding layer of the pixel areas adjacent to each other in a column direction.

7. The display panel of claim 6, wherein the first shielding layer, the second shielding layer, the first connection line, and the second connection line are formed as a single body.

8. The display panel of claim 2, further comprising an outer line in the peripheral area and connected to the first connection line and the second connection line.

9. The display panel of claim 1, wherein a voltage applied through the driving voltage line is a same as a voltage applied through the first shielding layer.

10. The display panel of claim 1, wherein the first shielding layer includes metal.

11. A display panel comprising:
- a substrate including a display area and a peripheral area surrounding the display area;
- a pixel circuit in a pixel area in which a row and a column cross each other in the display area of the substrate, and including a driving transistor and a switching transistor between a data line and the driving transistor; and
- a shielding layer including a first pattern overlapped with the driving transistor, a second pattern overlapped with the switching transistor, a first connection line extending from the first pattern in a row direction, and a second connection line extending from the first pattern in a column direction.

12. The display panel of claim 11, wherein the first connection line connects the first pattern in pixel areas adjacent to each other in a row direction, and
the second connection line connects the first pattern in the pixel areas adjacent to each other in a column direction.

13. The display panel of claim 11, wherein the first pattern is between the substrate and a semiconductor layer of the driving transistor, and the second pattern is between the substrate and a semiconductor layer of the switching transistor.

14. The display panel of claim 13, wherein the semiconductor layer of the driving transistor and the semiconductor layer of the switching transistor each include a silicon semiconductor.

15. The display panel of claim 11, wherein the first pattern is connected with the second pattern.

16. The display panel of claim 11, wherein the first pattern, the second pattern, the first connection line, and the second connection line are formed as a single body.

17. The display panel of claim 11, further comprising an outer line in the peripheral area and connected to the first connection line and the second connection line.

18. The display panel of claim 11, wherein the driving transistor is between a driving voltage line and a display element, and
- a voltage applied through the driving voltage line is a same as a voltage applied through the shielding layer.

19. The display panel of claim 18, further comprising
- an outer line in the peripheral area and connected to the first connection line and the second connection line; and
- a driving voltage supply line in the peripheral area and connected to the driving voltage line,
- wherein the outer line is connected to the driving voltage supply line.

20. The display panel of claim 11, wherein the shielding layer includes metal.

* * * * *